United States Patent [19]

Thakore et al.

[11] Patent Number: 5,255,208

[45] Date of Patent: Oct. 19, 1993

[54] ON-LINE PROCESSOR BASED DIAGNOSTIC SYSTEM

[75] Inventors: Prashant B. Thakore, Library; John L. Coulter, Leechburg; William D. Monaghan, Dravosburg, all of Pa.

[73] Assignee: AEG Westinghouse Transportation Systems, Inc., Pittsburgh, Pa.

[21] Appl. No.: 742,035

[22] Filed: Aug. 8, 1991

[51] Int. Cl.⁵ ............................................. G06F 11/00
[52] U.S. Cl. ........................... 364/551.01; 364/424.04; 371/16.5; 371/29.1
[58] Field of Search ................... 371/21.2, 16.5, 21.5, 371/21.6, 15.1, 29.1, 26, 25.1; 364/431.03, 551.01, 424.03, 424.04

[56] References Cited

U.S. PATENT DOCUMENTS

| | | | |
|---|---|---|---|
| 4,241,403 | 12/1980 | Schultz | 364/424.04 |
| 4,307,455 | 12/1981 | Juhasz et al. | 364/424.04 X |
| 4,484,329 | 11/1984 | Slamka et al. | 371/25.1 |
| 4,521,885 | 6/1985 | Melocik et al. | 364/424.03 X |
| 4,539,682 | 9/1985 | Herman et al. | 371/16.5 |
| 4,710,932 | 12/1987 | Hiroshi | 371/25.1 |
| 4,817,418 | 4/1989 | Asami et al. | 371/29.1 |
| 4,847,795 | 7/1989 | Baker et al. | 371/26 |
| 4,853,850 | 8/1989 | Krass et al. | 364/424.03 X |
| 4,906,970 | 3/1990 | Momura | 364/424.03 X |
| 4,926,330 | 5/1990 | Abe et al. | 364/424.03 |
| 5,051,996 | 9/1991 | Bergeson et al. | 371/15.1 |

*Primary Examiner*—Thomas G. Black
*Assistant Examiner*—Collin W. Park
*Attorney, Agent, or Firm*—Spencer, Frank & Schneider

[57] ABSTRACT

A method and apparatus for on-line diagnostics, particularly for use in power circuits of a DC-DC converter is described. Signals are sensed at selected strategic test points in a circuit and compared with stored expected signals for those points under normal operating conditions. Whenever the signals sensed at the selected test points do not correlate with the corresponding expected signals, the sensed signal is compared with abnormal signals stored in the memory associated with known failure conditions for that test point. Whenever the sensed signal matches closely with a signal for a known failure condition, an indication of the particular failure is logged into memory. If the sensed signal does not match a known failure condition, an indication of an unknown failure condition is logged into memory. Failure information can later be retrieved by maintenance personnel at a convenient time or can be displayed on an operator's display during operation.

22 Claims, 6 Drawing Sheets

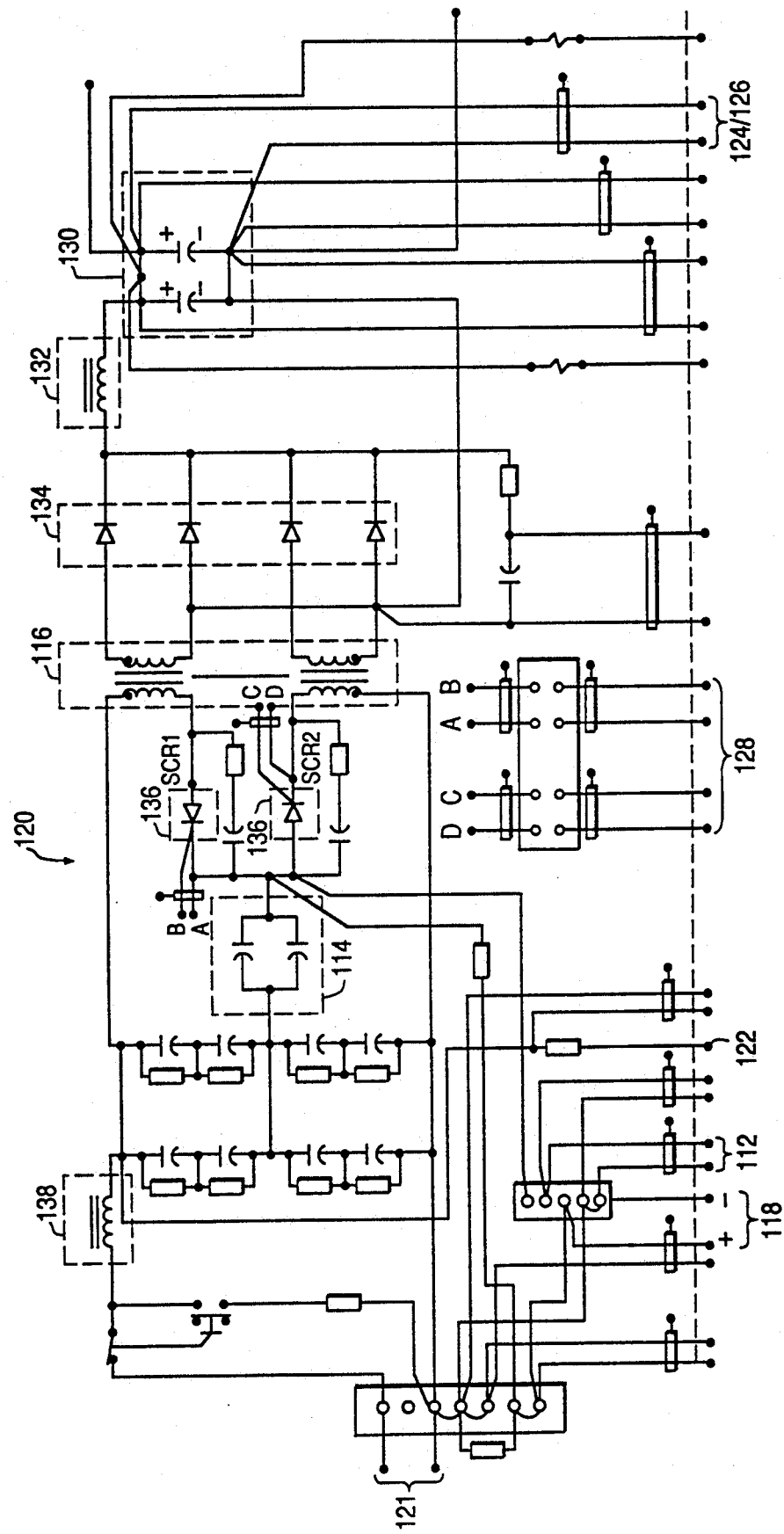

ON-LINE PROCESSOR BASED DIAGNOSTIC SYSTEM

BACKGROUND OF THE INVENTION

Field of the Invention

The invention relates to the field of diagnostic systems, and more particularly, to a diagnostic system for detecting faults and power failures in DC-DC converters used on mass transit vehicles.

Background Information

In DC-DC converters used on mass transit cars, trouble-shooting in case of a component failure is extremely difficult. It not only requires understanding of the power circuit on the part of the maintenance personnel, but also consumes a considerable amount of time and involves the risk associated with handling the high voltage circuit.

Various diagnostic systems for use with electromechanical systems are known. For example, U.S. Pat. No. 4,521,885, describes a diagnostic display apparatus for providing in-service and out-of-service diagnostics for various components of an electro-mechanical vehicle or other system. The diagnostics are performed by a software programmed micro-processor. In-service diagnostics include a continuous display of battery voltage which is interrupted if a predetermined fault condition is detected. For example, failure to detect pulsing at the collector of a supply transistor indicates that the transistor is shorted and causes interruption of the battery voltage.

U.S. Pat. No. 4,241,403, describes a method for automated analysis of vehicle performance. Data, such as vehicle speed, distance traveled and a predetermined set of operating events are recorded on board a vehicle and communicated to a computer which compares, off-line, the data with a predetermined profile and performs an analysis of the vehicle performance.

U.S. Pat. No. 4,906,970, relates to a vehicle on-board diagnostic system which includes a display unit connected to a data input processing circuit. This patent does not describe how the data processing circuit operates but rather relates more to the manner in which the processing circuit is connected to the various monitored components of the system.

U.S. Pat. No. 4,853,850, describes a vehicle computer diagnostic interface apparatus for preprocessing monitored data into a standardized data format for off-line diagnostic procedures.

U.S. Pat. No. 4,307,455, describes a power supply for computing means with data protected shut-down. According to the method of the patent, a central processing unit (CPU) is operable to sense vehicle operating parameters and is coupled to a vehicle battery for operating power. At least one vehicle parameter is sensed which is indicative of an engine shut-down condition. In response to the sensed shut-down condition, a data protect routine is executed to store data being processed by the CPU into the memory storage and disconnect the vehicle battery from the CPU after completion of the data protect routine.

U.S. Pat. No. 4,926,330, describes a diagnostic system for a motor vehicle which utilizes a portable diagnostic device comprising a micro-computer.

There is also a known system which includes an on-board annunciator panel indicating alarm conditions, power output and engine RPM, and whether excitation, engine turbo compression, traction motor and running gear conditions are within preset limits. This system also stores operating parameters for off-board analysis.

None of the above systems provides an on-line diagnostic system in which observed waveforms of a circuit are correlated in real time, while the circuit is operating, with normally expected waveforms and subsequently compared with waveforms corresponding to various failure conditions if there is no initial correlation between the observed waveform and the expected waveform.

SUMMARY OF THE INVENTION

It is therefore an object of the present invention to provide a processor based diagnostic system for detecting faults in an electric circuit.

It is a further object of the present invention to provide a diagnostic system which detects and records intermittent faults in the electric circuit.

It is a further object of the present invention to predict failures from deteriorating performance indicated by a change in signal waveforms at strategic test points.

The above and other objects are accomplished according to the invention by the provision of a diagnostic system and method in which signals at selected points are sensed and compared with stored normal signals. If there is a difference between the sensed signal and the stored normal signal, the sensed signal is then compared with stored abnormal signals. If a match occurs between a stored abnormal signal and the sensed signal, an indication of a failure condition is stored in a failure log.

When used as built-in, on-line diagnostics, the need for external DTE (Diagnostic Test Equipment) is eliminated and maintenance is simplified. The invention also has value for identifying certain intermittent failures which otherwise require temporary installation of recording instruments for collecting diagnostic data. For some components, it may also be possible to predict failures from deteriorating performance indicated by a change in signal waveforms at strategic test points.

According to one aspect of the invention, currents and voltages are sensed at several points in an electric circuit and these are compared to expected values under normal operating conditions.

According to another aspect of the invention, stored waveforms of normal operation and known fault conditions are compared with sensed waveforms in order to detect and identify particular fault conditions.

Utilizing the logic based method and apparatus according to the present invention, many of the tasks generally done by the service technician to find a failed component in the past can now be done by an on-board processor in real time.

The above and other objects and aspects of the invention are better understood with reference to the detailed description and accompanying drawings, and it will be understood that changes in the specific structure shown and described may be made within the scope of the claims without departing from the spirit of the invention.

BRIEF DESCRIPTION OF THE DRAWINGS

FIG. 9 is a schematic diagram of a DC-DC converter circuit in which the invention may be practiced.

DETAILED DESCRIPTION OF THE PREFERRED EMBODIMENT

Figure 1:
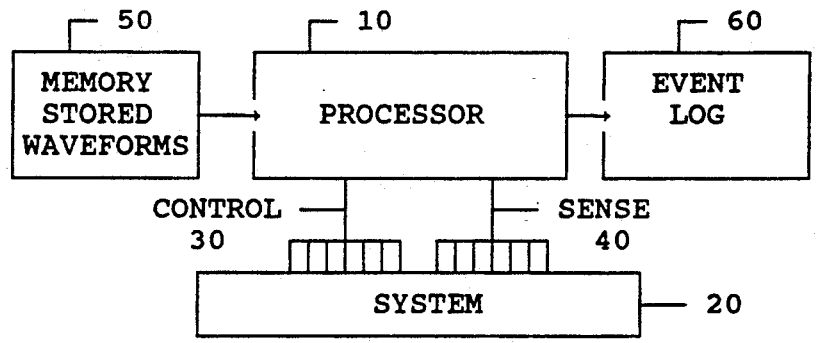
FIG. 1 is a block diagram of an embodiment of the invention.

FIG. 1 shows in block diagram form a basic embodiment of the present invention. Processor block 10 controls system 20 with control lines 30 and senses system operational signals and parameters, e.g., waveforms, with sense lines 40. Memory 50 contains pre-stored waveforms associated with normal operation of the system, and known abnormal operation, i.e., failure conditions. Processor 10 periodically compares the sensed waveforms with the stored waveforms and indicates any occurrences of detected abnormal operation in event log 60.

Figure 1A:
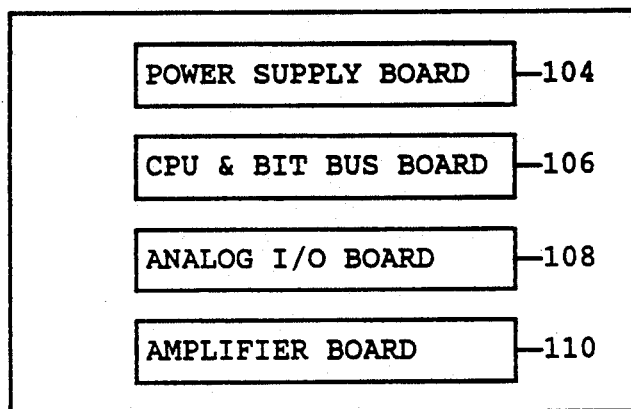
FIG. 1a is a block diagram/schematic of the major hardware components of an embodiment of the invention applied to a DC-DC converter of a power supply.
Figure 1A:
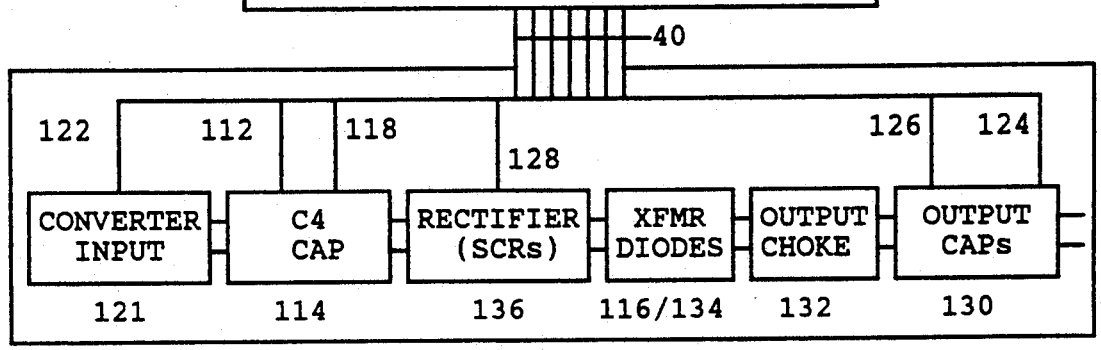

The invention will next be described in more detail by way of an example in which the invention is applied to a particular circuit, i.e., a DC-DC converter power circuit in a passenger carrying vehicle such as a subway train. The DC-DC converter power circuit with on-line diagnostics is shown in FIG. 1a in block diagram form. The DC-DC converter is shown in block diagram form in order to simplify the explanation. A more detailed schematic of a representative DC-DC converter is shown in FIG. 9. A method of performing diagnostics according to the invention is shown in flow chart form in FIG. 2. The processor of the diagnostic system in operation is shown in FIG. 3 in block diagram form. It should, however, be understood that the diagnostic method and apparatus according to the invention is not limited in application to the following description of a preferred embodiment and that this embodiment is presented only for explaining the invention. The diagnostic method and apparatus of the invention could be applied to any electronic, mechanical, or electromechanical system where on-line diagnostics would be desirable, e.g., where it would facilitate maintenance and repair by service personnel.

The diagnostic capabilities according to the invention are provided by an on-board processor within Converter Logic block 100 in the embodiment shown in FIG. 1a. Converter Logic block 100 includes four major printed circuit boards: Power Supply Board 104; CPU and Bit Bus Board 106; Analog Input/Output (I/0) Board 108; and Amplifier Board 110. On board 106 a computer based controller provides control functions such as voltage regulation, load shedding, and converter shutdown as well as diagnostic functions with communication capabilities via a serial communication link. Two microprocessors advantageously provide the above functions: an Intel 80186 or equivalent performs all aspects of converter control, diagnostics and task coordination; and an Intel 8044 microcontroller or its equivalent handles the details of communication.

Board 106 also contains program and working memory, interfaces, and various peripheral controllers as is standard for a single board processor. Significant to the invention is the presence of a real time clock on CPU and Bit Bus Board 106 used for time stamping events such as the occurrence of a fault in the converter being controlled and monitored.

Power Supply Board 104 consists of three DC to DC converter modules and is equipped with a low voltage detect circuit. Power Supply Board 104 supplies power to the other boards in Converter Logic 100 with the exception of Amplifier Board 110 which is kept isolated because it derives its power from a high voltage supply (600 Vdc).

Analog I/O Board 108 is designed to scale, filter and process analog input and output signals ($\pm 5$ v). The filtering function is provided by a three-pole low-pass filtering network with unity DC gain which ensures a clean DC signal. Scaling of the input is accomplished by choosing different values of scaling resistors which adjust the gain of an Operational amplifier (op-amp). Voltage clamping and current limiting of input signals is accomplished by the scaling resistors and by diode networks which clamp signals to $\pm 15$ v.

After scaling and filtering analog input, signals are processed by sample-and-hold and analog to digital (A/D) conversion. Input data is thereby produced and made ready to be read by the processor. Board 108 also provides the processor with analog output signal capabilities by means of digital to analog (D/A) conversion for interfacing to such output devices as chart recorders and the like.

Amplifier Board 110 derives its power from a high voltage supply and provides gate pulses for silicon controlled rectifiers 136 (SCR's) in DC-DC converter circuit 120.

The signals of certain strategic components in DC-DC converter power circuit 120 shown in FIGS. 1a and 9 are sensed and evaluated by converter logic block 100. For example, converter input terminals 121, "C4 CAP" (capacitor) arrangement 114, SCR's 136, power transformer 116, diodes 134, output choke 132, and output capacitors 130 may be monitored for normal and abnormal signals as shown.

By way of example, the following signals from DC-DC converter power circuit 120 are input to Converter Logic 100, and monitored by the processor therein for providing the online diagnostic capabilities according to the invention:

a. signal 122 representing the input voltage to the converter at input terminals 121;

b. signal 112 representing the rate of charge on the commutating capacitor arrangement 114 (the C4 rate signal);

c. signal 118 representing the voltage on the commutating capacitor arrangement 114 (the C4 Voltage);

d. rectifier pulses 128 to gates of SCR's 136;

e. output voltage signal 126 at output capacitors 130 of the DC-DC converter power circuit 120 and the level of ripple in the output voltage;

f. output current signal 124 of the DC-DC converter power circuit.

Figure 3:
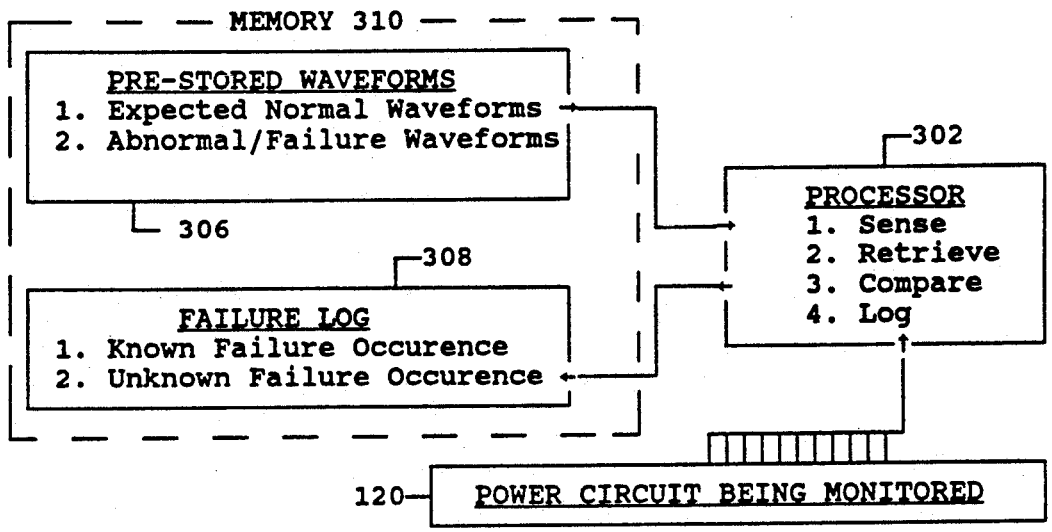
FIG. 3 is a block diagram of the major components of an embodiment of the invention.
Figure 4:
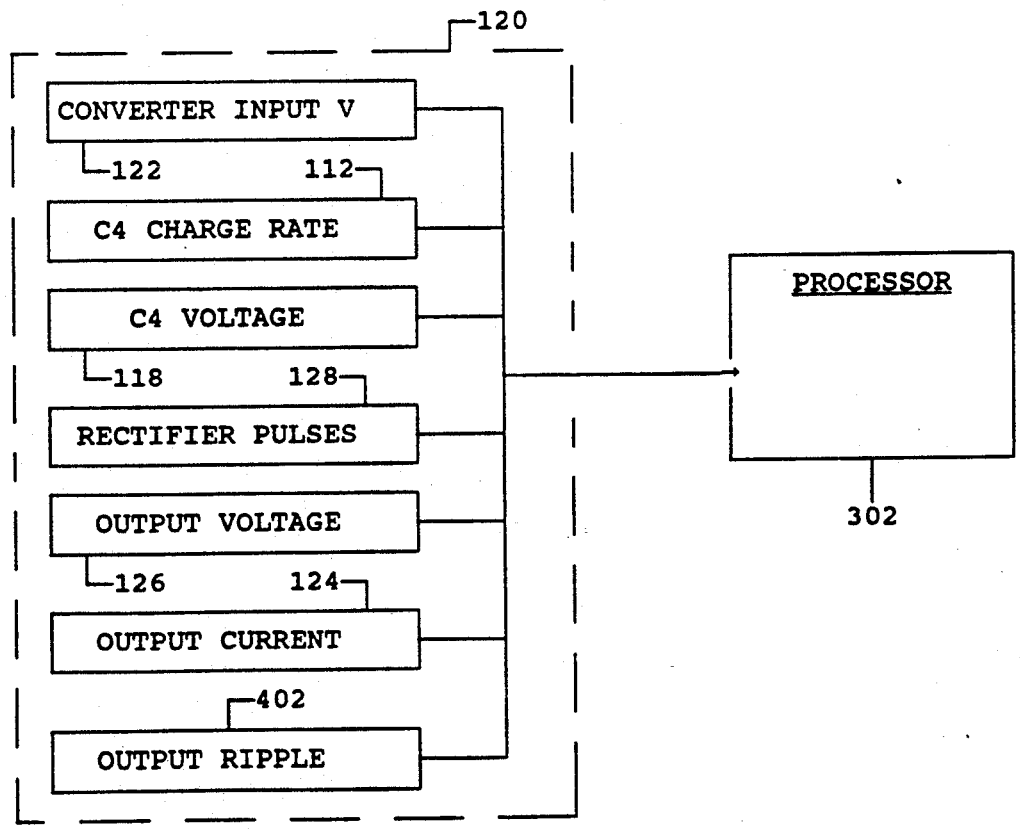
FIG. 4 is a block diagram showing the processor sensing a number of different signals from a power circuit.

These particular signals are shown schematically in FIG. 1a, and are shown diagrammatically being sensed by the processor in FIGS. 3 and 4.

Figure 2:
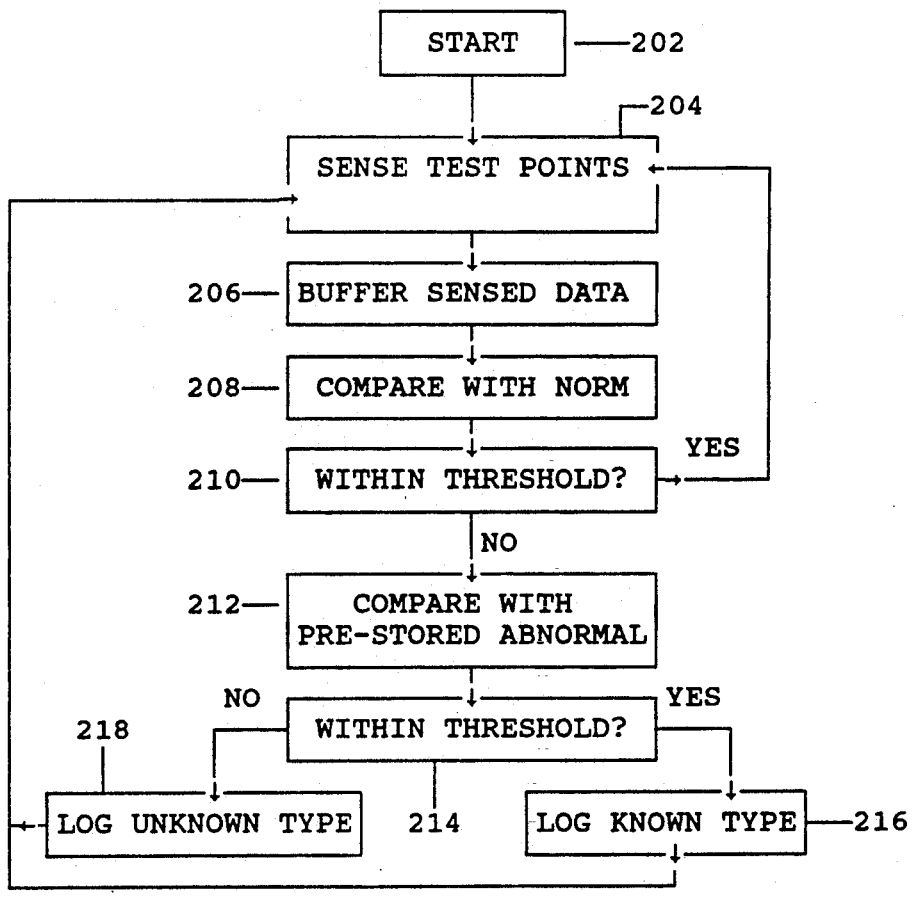
FIG. 2 is a flow diagram of an on-line diagnostic method according to an embodiment of the invention.

A flow diagram of an example of the basic method involved in the on-line diagnostics according to the invention is shown in FIG. 2 and will now be described. Upon start-up of the procedure, the processor begins at block 202 labeled "START." At the "SENSE TEST POINTS" block 204, the processor gathers data from test points in the DC-DC converter power circuit 120 and temporarily stores (buffers) the data as sensed waveforms in block 206. These sensed waveforms are compared with pre-stored normal expected waveforms in block 208.

During a logic development data gathering stage described later in more detail with reference to FIG. 8, typical waveforms of converter signals are collected and stored by the processor under different normal as well as failure conditions. These waveforms are then built into a "knowledge base" to be used by the diagnostic system. During real on-the-job operation of DC-DC converter power circuit 120, the sensed waveforms are compared at block 208 with the expected normal waveforms stored in the program memory to identify the existence of either normal operation or a failure condition.

Any difference from the comparison in block 208 between the sensed waveforms and the expected normal waveforms causes a comparison with an allowed threshold value in block 210. If the difference is below the threshold, the flow returns to the sense test points operation in block 204. If, however, the threshold is exceeded, the flow proceeds to block 212 where the sensed waveforms are compared with pre-stored abnormal waveforms one-by-one. In each comparison to a pre-stored abnormal waveform in block 212, another difference value is determined. A match is detected between a sensed waveform and a pre-stored abnormal waveform when the smallest of these difference values is below a second threshold in block 214.

If a match is detected, flow proceeds to block 216 and an indication of an identified type of abnormal or failure condition is logged in memory. If, however, there is no match detected between a sensed waveform and a pre-stored abnormal waveform, flow proceeds to block 218 where an indication of an unknown type of failure condition is logged in memory. In either case, flow then proceeds back to block 204, and sensing of test points continues. In both of blocks 208 and 212, one or more sensed waveforms from DC-DC converter power circuit 120 may be compared to detect abnormal signals.

It is noted that various failure conditions may produce abnormal waveforms at one or more, or all of the test points. And some failure conditions may be more accurately identified by comparing several waveforms from several test points with normal and failure waveforms. Therefore, the basic method described above would be modified accordingly within the scope of the invention.

In addition to logging an indication of a known or unknown failure condition in blocks 216 and 218 respectively, the time of day and other information useful to service personnel may be logged as well. For instance, the sensed abnormal waveform (or waveforms) associated with an unknown failure condition should advantageously be stored in the log. In this way, the existing data base of stored abnormal waveforms may be augmented because, once the unknown failure condition becomes identified, the data base can be updated to include this failure condition for future detection.

FIG. 3 illustrates the hardware for performing the above method in block diagram form including processor 302 sensing waveforms from DC-DC converter power circuit 120, retrieving stored normal and known abnormal waveforms 306 from memory 310, comparing sensed and retrieved waveforms and logging failure conditions into failure log 308 in memory 310. FIG. 4 shows labelled in block diagram form, by way of the above example, the various signals (122, 112, 118, 128, 126, 124 and 402) of DC-DC converter power circuit 120 which are sensed by processor 302.

Figure 5:
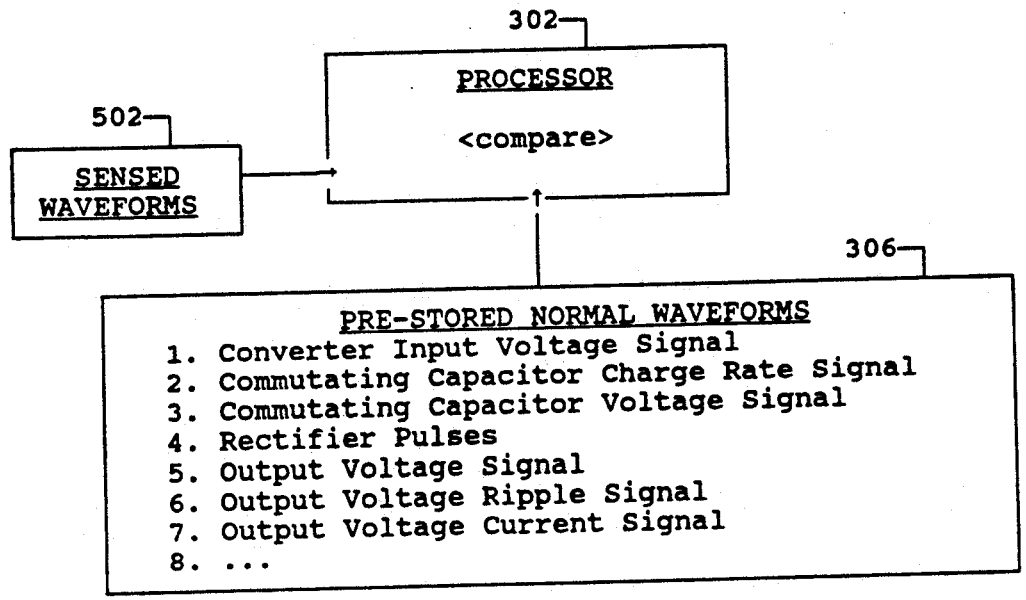
FIG. 5 is a block diagram showing the processor comparing sensed waveforms with normal expected waveforms.

The diagnostic system according to the invention is designed in such a way that in the "spare time" between real-time control activities, processor 302 performs the diagnostic method of FIG. 2 by sensing the signals (a) through (f) listed above and shown in FIG. 4, and comparing a sensed waveform or waveforms to those expected for normal operation for the existing input voltage and the load conditions. FIG. 5 illustrates processor 302 comparing sensed waveforms 502 with pre-stored, normal waveforms 306. As mentioned earlier, when there is no failure, the sensed and expected normal waveforms are highly correlated, that is, any difference between a sensed value and an expected value is below a preset threshold (210 in FIG. 2). This threshold may be affected by the range of operational values expected for a particular power circuit 120, as well as considerations of memory (310) size and processing capabilities of processor 302.

Figure 6:
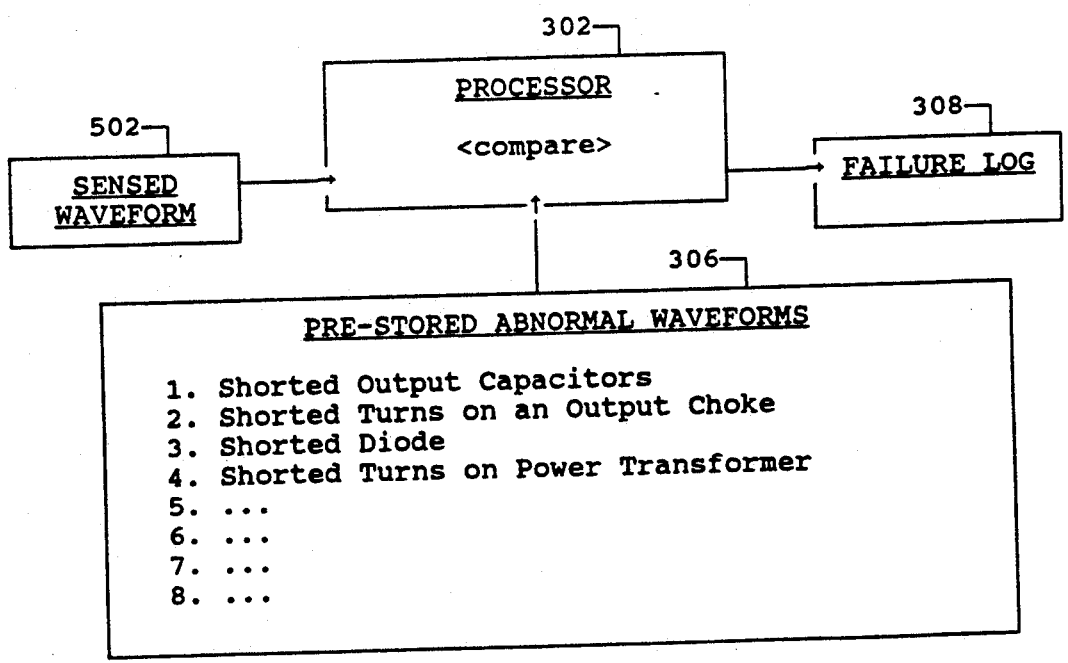
FIG. 6 is a block diagram showing the processor comparing a sensed waveform with pre-stored abnormal waveforms and logging a failure indication.

Whenever correlation is lost between the sensed 502 and expected 306 waveforms, that is, whenever the comparison 208 results in a difference beyond a certain threshold 210, a failure is considered detected. As illustrated in FIG. 6, to identify the particular failure condition, and thereby identify the failed component or components, sensed waveform(s) 502 is compared by the processor 302 (step 212 in FIG. 2) one-by-one with a series of pre-stored abnormal waveforms 306 representing known failure conditions. When one (or more) is found which matches closely, an indication is stored in the failure log 308.

For example, if the C4 charge rate signal 112 sensed by the processor 302 has a very high amplitude, it indicates an overcurrent condition in the DC-DC converter power circuit. This may be caused, for example, by any of the following failure conditions for which abnormal waveforms 306 are pre-stored in memory 310:

(a) shorted output capacitors 130, or
(b) an output choke 132 with internally shorted turns, or
(c) one or more shorted diodes 134, or
(d) shorted turns on the secondary of power transformer 116.

However, the C4 rate signal 112 will have different shapes in each of the above failure conditions (a) through (d). Waveforms 306 associated with each of the possible failure conditions are stored in memory 310 as shown in FIG. 6. If a match occurs between a stored waveform 306 for a particular failure condition and the sensed waveform 502, the particular failure condition is considered identified.

In order to identify a particular failure more accurately, it may be necessary to compare sensed waveforms 502 at more than one test point with expected waveforms 306 for those test points. In the above example, in addition to the C4 rate signal 112, corresponding sensed shapes of the rectifier pulses 128 can be compared with pre-stored expected shapes 306. The shape of the rectifier pulses 128 will be different and will change in each of the above cases of failures, (a) through (d). By comparing both the C4 rate signal 112 waveforms as well as the rectifier pulse shapes 128, it is possible to identify the reason for the particular failure condition, i.e., the failed component or components, more accurately.

With the method and apparatus according to the invention, what was generally done by the service technician to find a failed component in the past may now be done by the on-board processor in real time. Additionally, for some components, it may be possible to predict failures from deteriorating performance indicated by a change in signal waveforms at strategic test points in the circuit being monitored.

The computer based diagnostic procedure described above is in some respects similar to that followed by an experienced service technician during trouble-shooting of a DC-DC converter power circuit. The experienced service technician has knowledge based on study and experience of expected waveforms under normal and failure conditions, and he or she makes a determination of the failed component from observed (sensed) waveforms. In the automatic on-line diagnostic procedure according to the invention, the expected waveforms 306 are experimentally developed and stored in a knowledge data base (or built into the program) stored in memory 310. The built-in logic (processor 302) uses the stored waveform knowledge data base 306 during the diagnosis (FIG. 2). Several routines similar to the one just described for an abnormal C4 rate signal 112 can be executed by processor 302 between the real time control activities to achieve comprehensive and highly accurate on-line diagnostics. Intermittent problems are especially troublesome for the human service technician to cure. Unless they occur during the time when the technician is observing the circuit, they will likely go undetected and undiagnosed. If such a problem was suspected, a service technician in the past would hook-up bulky and complicated recording devices to the suspected circuitry, and then have to study the volumes of data collected by the devices at some later time. The present invention then has the advantage of sensing a circuit practically constantly during operation, making detection of intermittent problems almost certain. And since only abnormal data is stored, isolation of the problem may be as simple as reviewing the failure log.

Figures 7, 8:
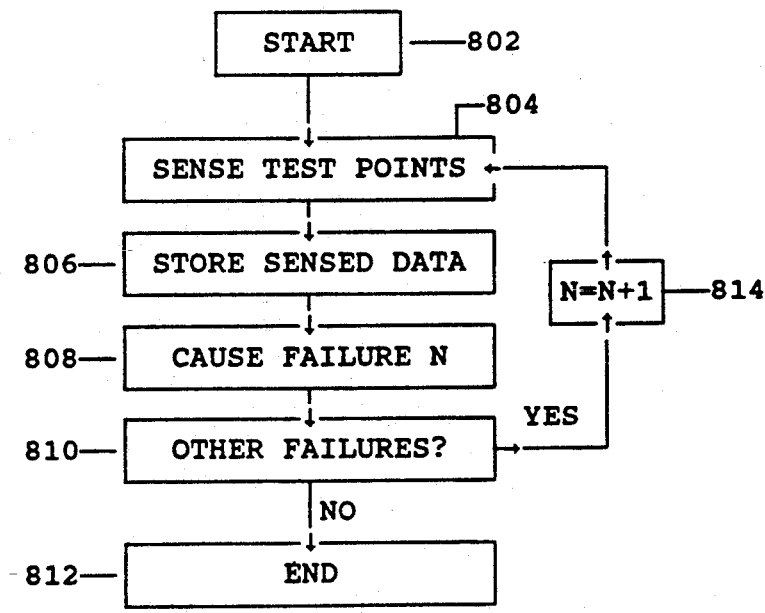
FIG. 7 is a representation of a failure log.
FIG. 8 is a flow diagram of a procedure to store data associated with known fault conditions according to an embodiment of the invention.

As shown diagrammatically in FIG. 7, failure log 308 stores at least the type of failure identified and an indication of the time of occurrence. As part of scheduled maintenance, or in response to a shut-down condition, failure log 308 could be down-loaded to the central computer of the vehicle and read by an operator. The vehicle operator could even order an appropriate replacement component before bringing the vehicle to a repair facility to be serviced by a service technician. In the past, the vehicle on which a DC-DC converter power circuit had failed first had to be brought to a repair facility. Then, a skilled service technician would use diagnostic test equipment (DTE), other test equipment, such as oscilloscopes, and experience to identify the failed component. But, because of the time-consuming nature of component level trouble-shooting, when a power circuit failed, it would sometimes be removed and simply replaced as a unit. The removed circuit would sometimes take several days for complete repair.

With the present invention, repair at the component level can be made rapidly and cost-effectively since the failed component is now identified by the on-board processor before the vehicle is even brought to the repair facility. Also, special skill and experience required of the service technician in trouble-shooting the specific type of power circuit is not necessary. Substantial savings in labor costs are then achieved by the described automatic on-line diagnostics according to the invention.

Referring now to FIG. 8, shown is an example of a simple diagnostic data base development routine for gathering data experimentally concerning a circuit to be subsequently diagnosed in real time. The process begins at block 802. At block 804, various test points are monitored under a range of normal operating conditions and the data gathered is stored in block 806. After the normal operational data is gathered, a first predetermined failure condition "N" is intentionally caused in block 808. Block 810 checks to see if this is the last failure to be caused. If this is not the last failure to be caused, flow proceeds through block 814, where a count N is incremented, to block 804. In block 804, data is sensed at the various test points for the present failure "N" and stored in block 806. At block 808, the next failure condition to be monitored is caused. The procedure is then repeated until data about all the desired, or feasible, failure conditions has been gathered and stored, at which point the procedure ends at block 812.

It should be pointed out that the diagnostic data base can be gathered in at least one of two ways: experimentally creating failures and recording the corresponding waveforms, as described above; or by creating the data base waveforms using a circuit simulation program, as described below.

Various electrical circuit simulation programs are known, such as the SPICE program, and its derivatives. These programs are based on the known mathematical relationships and behavior of circuit elements. Circuit component values, input voltages and currents, and connections (nodes) are fed into the program and the program can display various user requested output signals and waveforms in tabular or plot form. Thus, the DC-DC converter power circuit 120 can be simulated by such a program running on a digital computer.

Once the normal operation of the circuit has been simulated with such a program, various failure modes can be simulated by changing the component values and running the simulation program. For example, in the simplest case, to simulate the operation of an experimental circuit with a shorted 10k ohm resistor, the value for the resistor would be input as 0 ohms and the analysis run. In the case of a partially shorted output choke 132 in which the inductance is reduced to one-sixth of its original value, one would input the new inductance value and run the analysis.

By the above procedure, various failure modes can be simulated and data gathered about waveforms at certain strategic locations in the circuit associated with a respective failure mode. Advantageously, such a computer simulation method avoids the danger and expense of causing catastrophic failures in an actual circuit, i.e., failures in which components may actually be destroyed or damaged.

As described earlier, during the actual on-the-job diagnostic operation, prestored waveforms are compared with sensed waveforms. This is done in any of a number of known ways, for example, by performing a mathematical correlation procedure on the stored waveform data. In this method, the waveforms to be correlated have been stored as digital data, preferably, but not necessarily, of an equal number of data points. That is, an analog waveform associated with normal operation (or a known abnormal operation) is sampled and otherwise processed so that, for example, twenty-four digital values (data points) are stored over a given time period or cycle. Likewise, the sensed waveform is sampled and processed to provide twenty-four data points. Then a correlation procedure is performed using the data points. If the samples are of unequal length, then the waveform data would typically first be padded with zeros so that both sets of data are of equal length before correlation.

In performing the procedure, the reference (normal or known abnormal) data points are mathematically correlated with the sensed waveform data points, and the reference is also correlated with itself (auto-correlation). The results of the two correlation operations are then compared to see how closely they match. This can be done, for example, by a point by point comparison, or typically by summing all the elements of each correlation and then comparing the sums. The ratio of the sums gives an indication of the degree of correlation. A ratio of 1 indicates a perfect match. Ratios significantly larger or smaller than 1 indicate a poor match. If a sensed waveform poorly matches a normal waveform, a predetermined threshold value for the correlation-sum ratio will be exceeded, and a failure will be indicated. Then the correlation comparison is performed sequentially with known abnormal waveform data until a ratio meeting the threshold value is achieved, indicating identification of the particular failure sensed.

Of course this mathematical correlation technique is not necessary for the case of all waveforms, and simpler comparison techniques could be used. Further, the invention is suitable to the use of a variety of other comparison techniques. For example, reference waveforms could be stored as images, an image of a sensed waveform made, and an optical comparison of the waveforms performed by optical correlation or spatial frequency analysis.

A detailed schematic of a DC-DC converter power circuit to which the invention may be applied is illustrated in FIG. 9. While a detailed description of the DC-DC converter power circuit of FIG. 9 is not considered necessary for a full understanding of the invention, the following is provided to describe its basic operation. A high-voltage input 121, for example from the nominal 600 Vdc third rail supply in a subway train system, is inverted to an AC signal by the circuitry to the left of transformer 116. The gates of two SCR's 136 are controlled by converter logic 100, the converter logic firing SCR1 when commutating capacitors 114 are discharged (below 35 Vdc) and firing SCR2 when capacitors 114 are charged (over 450 Vdc). The primaries of transformer 116 step down the voltage of the AC signal applied to their input terminals and diodes 134 rectify the stepped-down AC signal at the secondary output terminals. Transformers 116 have a primary to secondary turns ratio of, for example, about 4 to 1. The resulting pulsed DC output by rectifiers 134 is filtered and output by output choke 132 and output capacitors 130 thereby providing suitable DC power for various electrical components of the vehicle.

The invention has been described as implemented in a DC-DC converter power circuit by way of example. However, the invention has broader applications. For example, the invention is not limited to use in DC-DC converter type power supplies. It may be used with numerous varieties of power circuits, such as chopper propulsion in DC motor drive, AC motor drive, electric or pneumatic cam control systems, etc. In general, the invention is useful in most micro-processor controlled electrical or electro-mechanical systems.

It will be understood that the above description of the present invention is susceptible to various modifications, changes, and adaptations, and the same are intended to be comprehended within the meaning and range of equivalents of the appended claims.

What is claimed is:

1. A method of on-line trouble-shooting failures in a circuit controlled by on-board processing means including memory for providing a failure log and for storing diagnostic information including normal signals and a plurality of known abnormal signals, the method comprising:

sensing signals at a plurality of points in the circuit and inputting the sensed signals to the processing means;

comparing the sensed signals with the stored normal signals;

comparing the sensed signals with the plurality of stored known abnormal signals when the comparison between the sensed signals and the normal signals indicates a difference which exceeds a certain threshold amount, otherwise returning to the sensing step; and storing in the failure log an indication of a failure condition and then returning to the sensing step when the comparison between the sensed and a particular one of the known abnormal signals indicates a match, otherwise storing in the failure log a general indication of a failure condition and then returning to the sensing step;

wherein the normal and plurality of known abnormal signals are stored as a plurality of waveforms, and the step of comparing the sensed signals with normal signals includes the steps of:

storing the sensed signals as waveforms; and sequentially retrieving and comparing the stored sensed signal waveforms with the plurality of normal signal waveforms to determine if a difference greater than a certain threshold exists between them;

and wherein the step of comparing the sensed signals with the plurality of known abnormal signals includes the step of:

sequentially retrieving and comparing stored sensed signal waveforms with the plurality of known abnormal signal waveforms to determine if a difference less than a certain threshold exists between them indicating a match.

2. The method of claim 1 wherein the steps of storing in the failure log an indication of the failure condition and storing in the failure log a general indication of a failure condition include storing the time of occurrence of the failure in the failure log.

3. The method of claim 1 wherein the circuit is a DC-DC converter power circuit having at least one output capacitor and output choke, at least one power transformer, and at least one diode, and said method includes storing at least one waveform of a failure condition for at least one of a shorted output capacitor, an output choke with internally shorted turns, a shorted diode, and shorted turns on the secondary of a power transformer.

4. The method of claim 1 further comprising the step of retrieving the failure condition indications from the failure log sometime subsequent to a failure in the circuit.

5. The method of claim 1 including performing the steps of said method during real time control activities of the processing means.

6. The method of claim 1, including setting the threshold amount so that a sensed degraded signal, representative of a gradually failing component or components in the circuit, exceeds the threshold amount.

7. The method of claim 1, including repeating rapidly and continually said steps of sensing, comparing and storing so that a diagnostic loop is formed whereby intermittent real-time failure conditions can be readily detected.

8. The method of claim 1, wherein the circuit is at least one of an electrical circuit, a mechanical circuit, and an electro-mechanical circuit.

9. The method of claim 1, wherein the steps of comparing comprise performing a mathematical correlation operation.

10. The method according to claim 1 performed by a system comprising:
first memory means for storing signals representing normal and known abnormal values at selected points in the circuit;
second memory means for storing an indication of failure incidents;
sensing means for sensing signals representing actual values at the selected points in the circuit;
processing means, connected to the first and second memory means and to the sensing means, and including:
comparing means for comparing the sensed signals with the stored signals, for determining if a failure incident has occurred and for determining if it is a known abnormal failure incident associated with a stored signal representing known abnormal values; and
logging means for logging into said second memory means an indication of either a known or unknown failure incident if said comparing means indicates the occurrence of a failure incident.

11. The system of claim 10, wherein said logging means includes means for logging into said second memory means the time of occurrence of the failure incident.

12. The system of claim 10, wherein said comparing means comprises correlating means for performing a correlation procedure on sensed and stored signals.

13. A method of on-line trouble-shooting failures in a circuit controlled by on-board processing means including memory for providing a failure log and for storing diagnostic information including normal signals and a plurality of known abnormal signals, the method comprising:
sensing signals at a plurality of points in the circuit and inputting the sensed signals to the processing means;
comparing the sensed signals with the stored normal signals;
comparing the sensed signals with the plurality of stored known abnormal signals when the comparison between the sensed signals and the normal signals indicates a difference which exceeds a certain threshold amount, otherwise returning to the sensing step; and
storing in the failure log an indication of a failure condition and then returning to the sensing step when the comparison between the sensed and a particular one of the known abnormal signals indicates a match, otherwise storing in the failure log a general indication of a failure condition and then returning to the sensing step;
wherein the circuit is a DC-DC converter power circuit having an input voltage, a commutating capacitor, a rectifier, the power circuit providing an output voltage and an output current, and wherein the step of sensing signals at a plurality of points in the circuit comprises at least two of the following sub-steps:
sensing a signal representing converter input voltage;
sensing a signal representing the rate of charge on a commutating capacitor;
sensing a signal representing the voltage on a commutating capacitor;
sensing rectifier pulses;
sensing converter output voltage and ripple level thereof; and
sensing converter output current.

14. The method of claim 13 wherein the steps of storing in the failure log an indication of the failure condition and storing in the failure log a general indication of a failure condition include storing the time of occurrence of the failure in the failure log.

15. The method of claim 13 further comprising the step of retrieving the failure condition indications from the failure log sometime subsequent to a failure in the circuit.

16. The method of claim 13 including performing the steps of said method during real time control activities of the processing means.

17. The method of claim 13, including setting the threshold amount so that a sensed degraded signal, representative of a gradually failing component or components in the circuit, exceeds the threshold amount.

18. The method of claim 13, including repeating rapidly and continually said steps of sensing, comparing and storing so that a diagnostic loop is formed whereby intermittent real-time failure conditions can be readily detected.

19. The method of claim 13, wherein the steps of comparing comprise performing a mathematical correlation operation.

20. The method according to claim 13 performed by a system comprising:
first memory means for storing signals representing normal and known abnormal values at selected points in the circuit;
second memory means for storing an indication of failure incidents;
sensing means for sensing signals representing actual values at the selected points in the circuit;
processing means, connected to the first and second memory means and to the sensing means, and including:
comparing means for comparing the sensed signals with the stored signals, for determining if a failure incident has occurred and for determining if it is a known abnormal failure incident associated with a stored signal representing known abnormal values; and logging means for logging into said second memory means an indication of either a known or unknown failure incident if said comparing means indicates the occurrence of a failure incident.

21. The system of claim 20, wherein said logging means includes means for logging into said second memory means the time of occurrence of the failure incident.

22. The system of claim 20, wherein said comparing means comprises correlating means for performing a correlation procedure on sensed and stored signals.

* * * * *